(12) United States Patent
Li et al.

(10) Patent No.: US 11,476,328 B2
(45) Date of Patent: Oct. 18, 2022

(54) STACKED NANOWIRE OR NANOSHEET GATE-ALL-AROUND DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Yongliang Li, Beijing (CN); Xiaohong Cheng, Beijing (CN); Qingzhu Zhang, Beijing (CN); Huaxiang Yin, Beijing (CN); Wenwu Wang, Beijing (CN)

(73) Assignee: Institute of Microelectronics, Chinese Academy of Sciences

( * ) Notice: Subject to any disclaimer, the term of this patent is extended or adjusted under 35 U.S.C. 154(b) by 0 days.

(21) Appl. No.: 16/824,810

(22) Filed: Mar. 20, 2020

(65) Prior Publication Data

US 2021/0151561 A1 May 20, 2021

(30) Foreign Application Priority Data

Nov. 14, 2019 (CN) .......................... 201911113939.8

(51) Int. Cl.
*H01L 29/06* (2006.01)
*H01L 29/423* (2006.01)
(Continued)

(52) U.S. Cl.
CPC .. *H01L 29/0669* (2013.01); *H01L 21/823412* (2013.01); *H01L 21/823431* (2013.01);
(Continued)

(58) Field of Classification Search
CPC ........... H01L 29/0669; H01L 29/42368; H01L 29/42392; H01L 21/823412;
(Continued)

(56) References Cited

U.S. PATENT DOCUMENTS 10,790,280 B2 * 9/2020 Ching ................... H01L 29/785
10,818,559 B1 * 10/2020 Cheng ................. H01L 29/6653
(Continued)

*Primary Examiner* — Christine A Enad
(74) *Attorney, Agent, or Firm* — Goodwin Procter LLP

(57) ABSTRACT

A stacked nanowire or nanosheet gate-all-around device, including: a silicon substrate; stacked nanowires or nanosheets located on the silicon substrate, extending along a first direction gate stacks and including multiple nanowires or nanosheets that are stacked; a gate stack, surrounding each of the stacked nanowires or nanosheets, and extending along a second direction, where first spacers are located on two sidewalls of the gate stack in the first direction; source-or-drain regions, located at two sides of the gate stack along the first direction; a channel region, including a portion of the stacked nanowires or nanosheets that is located between the first spacers. A notch structure recessed inward is located between the stacked nanowires or nanosheets and the silicon substrate, and includes an isolator that isolates the stacked nanowires or nanosheets from the silicon substrate. A method for manufacturing the stacked nanowire or nanosheet gate-all-around device is further provided.

4 Claims, 10 Drawing Sheets

(51) Int. Cl.
*H01L 29/66* (2006.01)
*H01L 21/8234* (2006.01)
*H01L 21/84* (2006.01)

(52) U.S. Cl.
CPC .... *H01L 21/823468* (2013.01); *H01L 21/845* (2013.01); *H01L 29/42368* (2013.01); *H01L 29/42392* (2013.01); *H01L 29/6656* (2013.01)

(58) Field of Classification Search
CPC ..... H01L 21/823468; H01L 21/823431; H01L 21/845
See application file for complete search history.

(56) References Cited

U.S. PATENT DOCUMENTS

| | | | |
|---|---|---|---|
| 2013/0320455 A1* | 12/2013 | Cappellani | H01L 29/66795 257/368 |
| 2018/0175036 A1* | 6/2018 | Ching | H01L 29/0653 |
| 2019/0312104 A1* | 10/2019 | Cheng | H01L 21/845 |
| 2020/0105869 A1* | 4/2020 | Loubet | H01L 29/7851 |
| 2021/0151557 A1* | 5/2021 | Li | H01L 29/66545 |

* cited by examiner

STACKED NANOWIRE OR NANOSHEET GATE-ALL-AROUND DEVICE AND METHOD FOR MANUFACTURING THE SAME

The present disclosure claims the priority to Chinese Patent Application No. 201911113939.8, titled "STACKED NANOWIRE OR NANOSHEET GATE-ALL-AROUND DEVICE AND METHOD FOR MANUFACTURING THE SAME," filed on Nov. 14, 2019 with the China National Intellectual Property Administration, the content of which is incorporated herein by reference.

FIELD

The present application relates to the technical field of semiconductors, and in particular to a stacked nanowire or nanosheet gate-all-around device and a method for manufacturing the stacked nanowire or nanosheet gate-all-around device.

BACKGROUND

As a feature size of a device enters a technology node of 5 nm, a degradation in mobility is caused by a quantum effect, and a saturation effect in strain engineering is caused by continuous miniaturization of the device. Thereby, a performance of the device gradually degrades as the device scaling. Due to high carrier mobility, high mobility channels materials, such as SiGe or Ge, are becoming a hotspot in research of novel three-dimensional devices.

A band gap of a material for high mobility channel, such as Ge, is small. Hence, a leakage is more severe than a silicon-based channel, which reduces the performance of the device.

SUMMARY

In conventional technology, there is a severe leakage current in a stacked nanowire or nanosheet gate-all-around (GAA) device made of a silicon-based channel material or a high-mobility channel material such as Ge. In order to address the above technical issue, a stacked nanowire or nanosheet GAA device and a method for manufacturing the stacked nanowire or nanosheet GAA device are provided according to embodiments of the present disclosure.

A stacked nanowire or nanosheet GAA device is provided, including: a silicon substrate, stacked nanowires or nanosheets, a gate stack, source-or-drain regions, and a channel region. The stacked nanowires or nanosheets are located on the silicon substrate, and each of the stacked nanowires or nanosheets extends along a first direction. The stacked nanowires or nanosheets include multiple nanowires or nanosheets that are stacked. The gate stack surrounds each of the stacked nanowires or nanosheets, and extends along a second direction. First spacers are located on two sidewalls of the gate stack, and the sidewalls are in the first direction of the gate stack. The source-or-drain regions are located at two sides of the gate stack along the first direction. The channel region includes a portion of the stacked nanowires or nanosheets that is located between the first spacers. A notch structure recessed inward is located between the stacked nanowires or nanosheets and the silicon substrate. The notch structure includes an isolator that isolates the stacked nanowires or nanosheets from the silicon substrate.

In one embodiment, the isolator is an oxide.

In one embodiment, each of the stacked GAA nanowires or nanosheets is made of $Si_{1-y}Ge_y$, where $0 \leq y \leq 1$.

In one embodiment, a silicon-etched structure is located between the silicon substrate and the notch structure. In another embodiment, another silicon-etched structure is located between the gate stack and the notch structure.

In one embodiment, a strain-buffer structure is located between the silicon substrate and the notch structure. In another embodiment, another strain-buffer structure is located between the gate stack and the notch structure. Each of the strain-buffer structure and the another strain-buffer structure is made of $Si_{1-z}Ge_z$, where $0 \leq z \leq 0.8$.

A method for manufacturing a stacked nanowire or nanosheet GAA device is further provided, including: providing a silicon substrate; forming at least one sacrificial layer and at least one material layer that are alternately stacked on the silicon substrate; forming multiple first fins along a first direction on the silicon substrate, and multiple second fins along the first direction on the multiple first fins; forming notch structures on the silicon substrate; forming an isolator in each of the notch structures, to isolate the multiple first fins from the silicon substrate; forming a dummy gate and first spacers on two sides of the dummy gate, along a second direction on the multiple first fins and the multiple second fins; etching the multiple second fins at two sides of the first spacers, or both the multiple first fins and the multiple second fins at two sides of the first spacers; growing a source-drain epitaxial layer at the two sides of the first spacers on the etched multiple second fins, or on both the etched multiple second fins and the etched multiple first fins, to form source-or-drain regions; and replacing the dummy gate with a gate stack, to form the stacked nanowire or nanosheet GAA device.

In one embodiment, a strain-buffer layer is formed on the silicon substrate, before forming the at least one sacrificial layer and the at least one material layer that are alternately stacked on the silicon substrate, where the strain-buffer layer is made of $Si_{1-z}Ge_z$, $0 \leq z \leq 0.8$, and a thickness of the strain-buffer layer ranges from 0.5 μm to 3.5 μm.

In one embodiment, forming the notch structures on the silicon substrate includes: passivating the multiple first fins and the multiple second fins with $O_2$ plasma; and performing isotropic etching, to form the notch structures on the silicon substrate.

In one embodiment, forming the notch structures on the silicon substrate includes: forming second spacers on sidewalls of each of the multiple first fins and each of the multiple second fins in the first direction and the second direction; and performing isotropic etching, to form the notch structures on the silicon substrate.

In one embodiment, multiple third fins are formed on the silicon substrate, after forming the notch structures on the silicon substrate and before forming the isolator in each of the notch structures.

In one embodiment, forming the isolator in each of the notch structures includes: oxidizing the multiple first fins, the multiple second fins, the notch structures, and the third fins in an $O_2$-based atmosphere, wherein the oxidizing is cycled for one or more times, to form the isolator in each of the notch structures.

In one embodiment, the oxidizing is performed at a temperature ranging from 600° C. to 900° C. for a period ranging from 30 seconds to 60 seconds, and is cycled for no more than 5 times.

In one embodiment, replacing the dummy gate with the gate stack includes: depositing an oxide dielectric layer that covers the multiple first fins, the multiple second fins, the dummy gate, and the first spacers and the source-or-drain regions; planarizing the oxide dielectric layer; removing the dummy gate; removing the at least one sacrificial layer in a gate region, or both the at least one sacrificial layer and the multiple first fins in a gate region, to expose a channel region; and forming, in the channel region, a gate dielectric layer and a gate on the gate dielectric layer.

In one embodiment, the at least one material layer is made of $Si_{1-y}Ge_y$, a thickness of each of the at least one material layer ranges from 8 to 25 nm, the at least one sacrificial layer is made of $Si_{1-x}Ge_x$, and a thickness of at least one material layer ranges from 5 to 25 nm, where $0 \leq y \leq 1$ and $0 \leq x \leq 0.8$.

In summary, the stacked nanowire or nanosheet GAA device provided according to an embodiment of the present disclosure is a novel structure for nanowire or nanosheet GAA devices which include high mobility channels. Specifically, an oxide for isolation is formed in the notch structures between the silicon substrate and the stacked nanowires or nanosheets. It is ensured that a leakage current is reduced while maintaining a high performance of a silicon-based channel or a high-mobility channel, such as a Ge channel, thereby improving capacities of the device.

It is appreciated that the above advantage also applies to the method for manufacturing the stacked nanowire or nanosheet GAA device according to an embodiment of the present disclosure.

Figure 1:
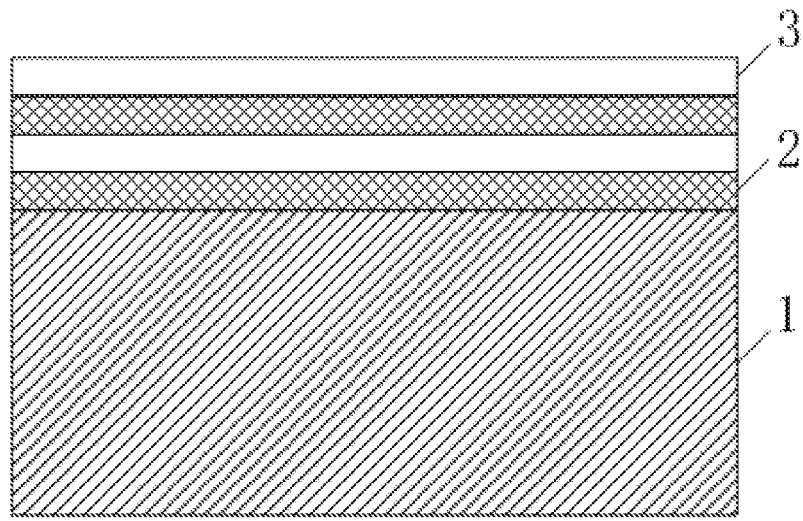
FIG. 1 is a schematic diagram of a cross section after forming sacrificial layers and material layers that are alternately stacked on a silicon substrate.

| Reference Numerals: | |
|---|---|
| 1: silicon substrate, | 2: sacrificial layer, |
| 3: material layer, | 4: first fin, |
| 5: second fin, | 6: notch structure, |
| 7: third fin, | 8: oxide, |
| 9: first spacer, | 10: strain-buffer layer, |
| 11: second spacer, | 12: shallow trench isolation, |
| 13: channel region, | 14: gate dielectric layer, |
| 15: gate. | |

DETAILED DESCRIPTION

Hereinafter embodiments of the present application are illustrated in conjunction with drawings.

Various specific details are set forth as follows for a full understanding of the present disclosure. The present disclosure may further be implemented in embodiments other than what is described herein. Therefore, the present disclosure is not limited by the embodiments disclosed hereinafter.

In conventional technology, there is a severe leakage current in a stacked nanowire or nanosheet gate-all-around (GAA) device made of a silicon-based channel material or a high-mobility channel material such as Ge. In order to address the above technical issue, a stacked nanowire or nanosheet GAA device is provided according to an embodiment of the present disclosure. An oxide for isolation is formed in a notch structure between a silicon substrate and stacked nanowires or nanosheets. It can be ensured that a leakage current is reduced while maintaining a high performance of a silicon-based channel or a high-mobility channel, such as a Ge channel, thereby improving capacities of the device. A method for manufacturing a stacked nanowire or nanosheet GAA device is further provided according to an embodiment of the present disclosure.

Reference is made to FIGS. 15 to 18. A stacked nanowire or nanosheet GAA device according to an embodiment of the present application includes: a silicon substrate 1, stacked nanowires or nanosheets, a gate stack, source-or-drain regions, and a channel region 13.

The stacked nanowires or nanosheets are located on the silicon substrate 1. Each stacked nanowire or nanosheet extends along a first direction. The stacked nanowires or nanosheets includes multiple nanowires or nanosheets that are stacked.

The gate stack surrounds each of the stacked nanowires or nanosheets, and extends along a second direction. First spacers 9 are located on two sidewalls of the gate stack, and the sidewalls are in the first direction of the gate stack.

The source-or-drain regions are located at two sides of the gate stack, along the first direction.

The channel region 13 includes a portion of the stacked nanowires or nanosheets that is located between the first spacers 9.

A notch structure 6 recessed inward is located between the stacked nanowires or nanosheets and the silicon substrate 1. The notch structure 6 includes an isolator that isolates the nanowires and nanosheets from the silicon substrate 1.

In this embodiment, the notch structure 6 may be formed between the stacked nanowires or nanosheets and the silicon substrate 1. The notch structure 6 may be a symmetrical structure in a direction perpendicular to an extending direction of the stacked nanowires or nanosheets in a plane parallel to the substrate, and is recessed inward from both sides. Also, it is appreciated that the notch structure 6 may be an asymmetric structure. The gate stack includes a gate dielectric layer 14, and a gate 15 on the gate dielectric layer 14.

In one embodiment, the isolator may be an oxide 8.

In this embodiment, the isolator is the oxide 8. The oxide 8 is formed in the notch structure 6 by oxidizing the notch structure 6 that has been formed. Namely, the notch structure 6 is pinched off through oxidization. Specifically, the whole notch structure 6 may be oxidized to form the oxide 8. Alternatively, only a portion of the notch structure 6 with a small width may be oxidized to form the oxide 8. The height of the oxide 8 for pinching off should be greater than 3 nm, and otherwise the stacked nanowires or nanosheets may not be isolated from the silicon substrate 1. In one embodiment, the height of the oxide 8 is 10 nm.

In one embodiment, the stacked nanowires or nanosheets are made of $Si_{1-y}Ge_y$, and $0 \leq y \leq 1$.

In this embodiment, the stacked nanowires or nanosheets 2 with an expression of $Si_{1-y}Ge_y$ are made of Si in case of y=0, is made of Ge in case of y=1, and includes Ge of a certain concentration in case of 0<y<1. Namely, the channel region 13 may be a silicon-based channel, or a high-mobility material channel such as a Ge channel.

In one embodiment, a silicon-etched structure is located between the silicon substrate 1 and the notch structure 6. In another embodiment, another silicon-etched structure is further located between the gate stack and the notch structure 6.

Figure 15:
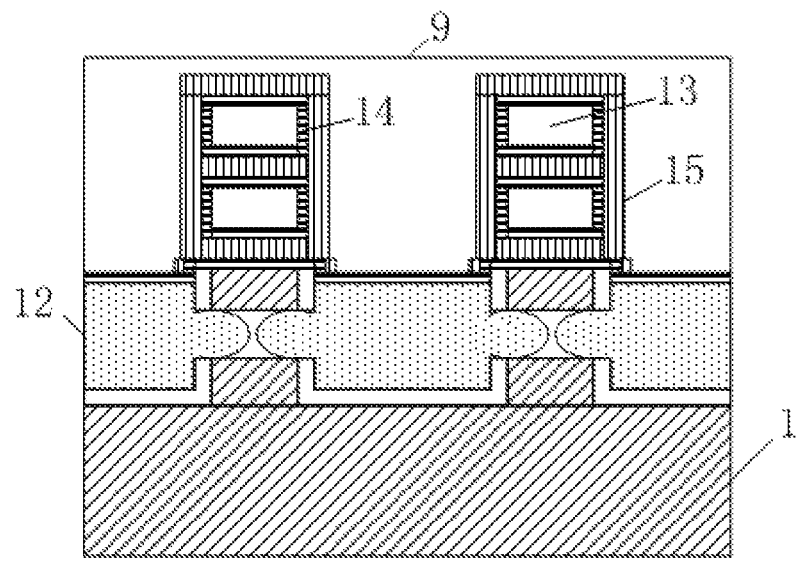
FIG. 15 is a schematic diagram of a cross section of a stacked nanowire or nanosheet gate-all-around device according to a first embodiment of the present application.

In these embodiments, there is no strain-buffer layer formed on the silicon substrate 1 in manufacture of the semiconductor device. The silicon substrate 1 is etched to form the notch structure, and then may be further etched downward in subsequent processing. In such case, the silicon-etched structure is formed both above and below the notch structure 6 by etching the silicon substrate 1. Reference is made to FIG. 15. The silicon-etched structure above the notch structure 6 may not be removed during releasing the channel region 13 in subsequent processing. Thereby, the silicon-etched structure remains both between the silicon substrate 1 and the notch structure 6 and between the gate stack and the notch structure 6.

Figure 16:
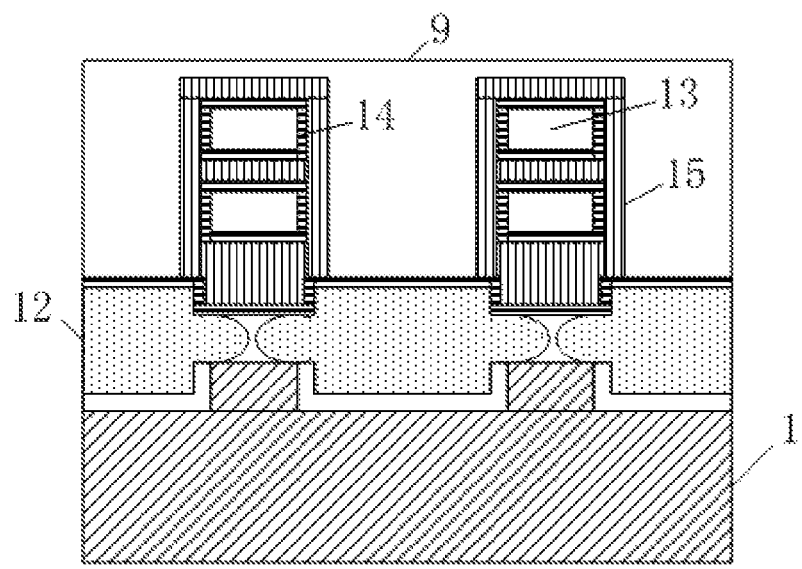
FIG. 16 is a schematic diagram of a cross section of a stacked nanowire or nanosheet gate-all-around device according to a second embodiment of the present application

Reference is made to FIG. 16. The silicon-etched structure above the notch structure 6 may be removed together with the sacrificial layer 2 during releasing the channel region 13 in subsequent processing. In such case, the silicon-etched structure merely remains between the silicon substrate 1 and the notch structure 6.

In one embodiment, a strain-buffer structure is located between the silicon substrate 1 and the notch structure 6. In another embodiment, another strain-buffer structure is further located between each of the gate stack and the notch structure 6. The strain-buffer structure is made of $Si_{1-z}Ge_z$, and $0 \leq z \leq 0.8$.

Figure 17:
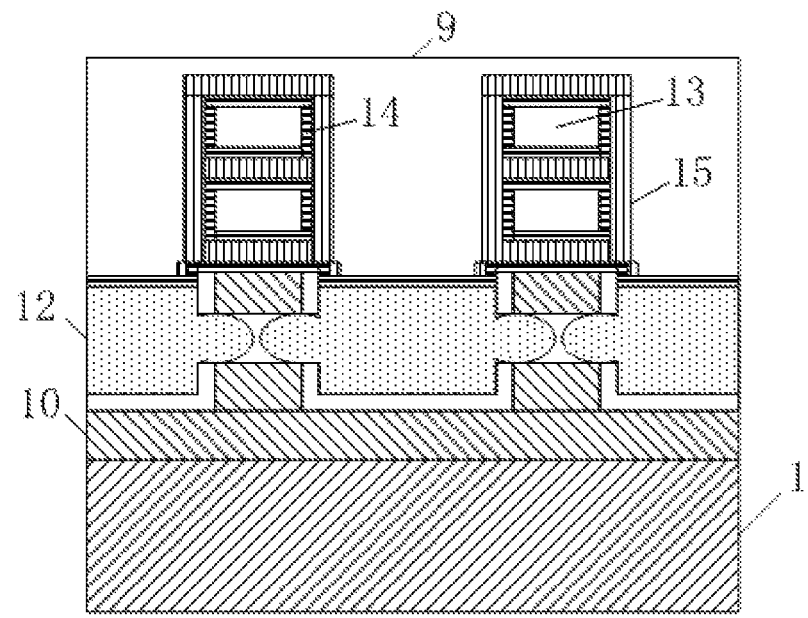
FIG. 17 is a schematic diagram of a cross section of a stacked nanowire or nanosheet gate-all-around device according to a third embodiment of the present application.

In these embodiments, a strain-buffer layer 10 may be formed on the silicon substrate 1 in manufacture of the semiconductor device. The strain-buffer layer 10 is etched to form the notch structure 6, and then may be further etched downward in subsequent processing. In such case, the strain-buffer structure is formed both above and below the notch structure 6 by etching the strain-buffer layer 10. Reference is made to FIG. 17. The strain-buffer structure above the notch structure 6 may not be removed in releasing the channel region 13 in subsequent processing. Thereby, the strain-buffer structure remains both between the silicon substrate 1 and the notch structure 6 and between the gate stack and the notch structure 6.

Figure 18:
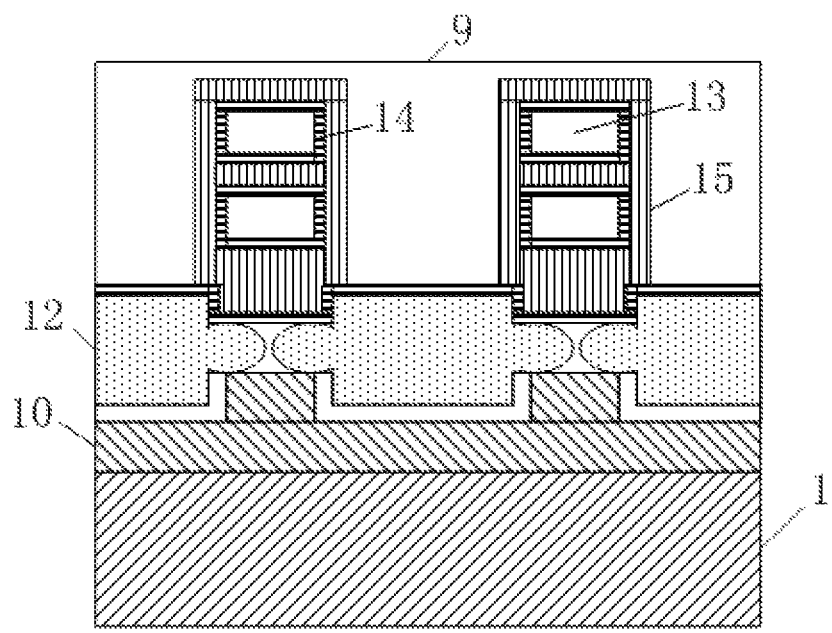
FIG. 18 is a schematic diagram of a cross section of a stacked nanowire or nanosheet gate-all-around device according to a fourth embodiment of the present application.

Reference is made to FIG. 18. The strain-buffer structure above the notch structure 6 may be removed together with the sacrificial layer 2 in releasing the channel region 13 in subsequent processing. In such case, the strain-buffer structure merely remains between the silicon substrate 1 and the notch structure 6.

It should be noted that both the silicon substrate 1 and the strain-buffer layer 10 may not be etched further downward after the notch structure 6 is formed, no matter the notch structure is formed by etching the silicon substrate 1 or the strain-buffer layer 10. In such case, the corresponding silicon-etched structure or strain buffer structure is not formed between the substrate 1 and the notch structure 6.

According to the above technical solutions, an oxide 8 for isolation is formed in the notch structure 6 between the silicon substrate 1 and the stacked nanowires or nanosheets. It is ensured that a leakage current is reduced while maintaining a high performance of a silicon-based channel or a high-mobility channel, such as a Ge channel, thereby improving capacities of the device.

Figure 19:
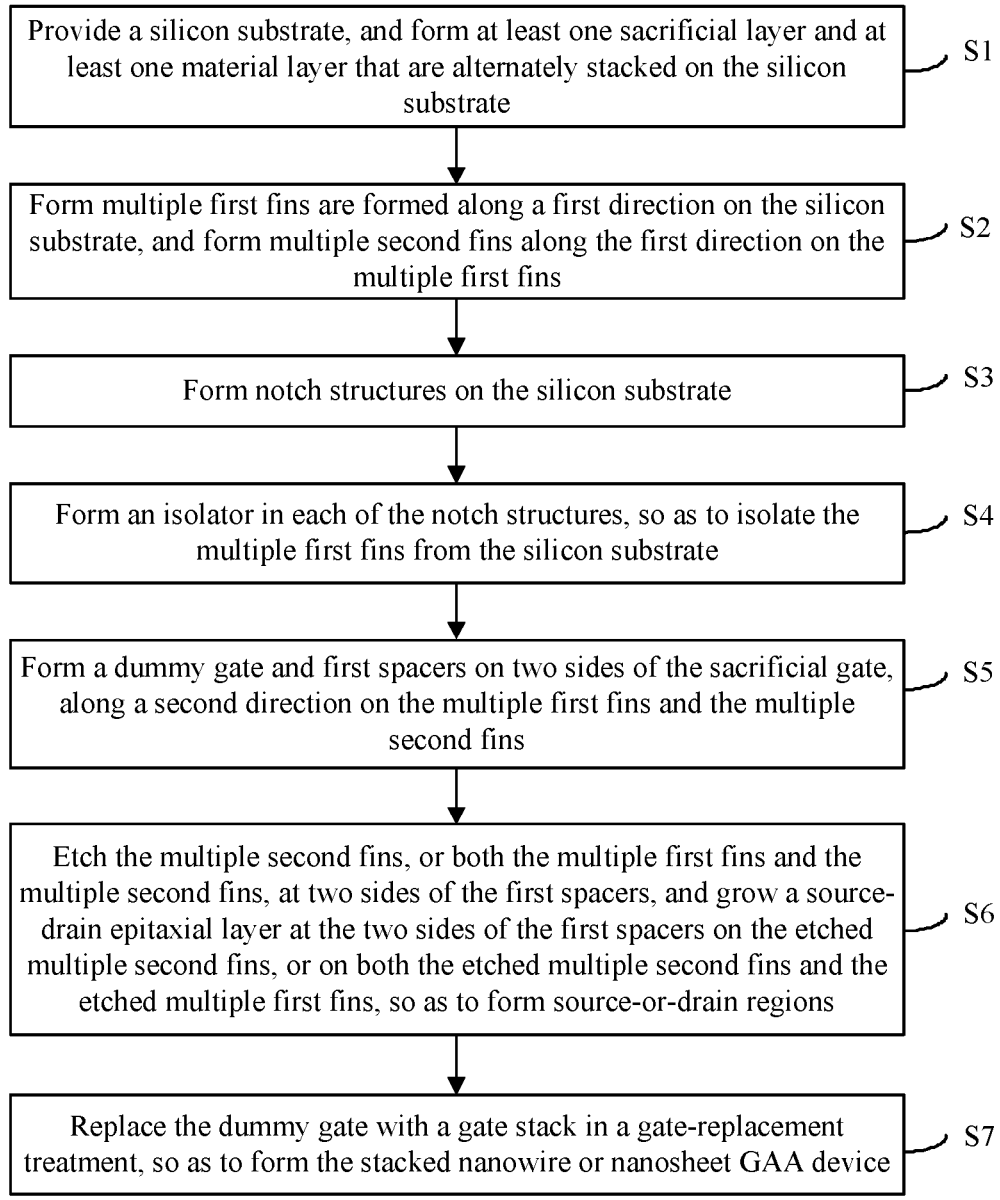
FIG. 19 is a flowchart of a method for manufacturing a stacked nanowire or nanosheet gate-all-around device according to an embodiment of the present application.

A method for manufacturing a stacked nanowire or nanosheet GAA device is further provided according to an embodiment of the present disclosure. Reference is made to FIG. 19. The method includes steps S1 to S7.

In step S1, a silicon substrate 1 is provided, and at least one sacrificial layer 2 and at least one material layer 3 that are alternately stacked are formed on the silicon substrate 1.

Reference is made to FIG. 1.

In this step, a sacrificial layer 2 may be firstly ground on the silicon substrate 1, and then a material layer 3 may be grown on the sacrificial layer 2, through reduced-pressure epitaxy or molecular beam epitaxy. A stack of sacrificial layers 2 and material layers 3 that are alternately arranged with two or more periods may be grown on the silicon substrate 1 through epitaxy. For example, a quantity of the periods in the stack may be two or three. In an embodiment, the material layer 3 is made of $Si_{1-y}Ge_y$ and has a thickness ranging from 8 nm to 25 nm. For example, a thickness of the material layer 3 ranges from 10 nm to 20 nm. In an embodiment, the sacrificial layer 2 is made of $Si_{1-x}Ge_x$ and has a thickness of ranging from 5 nm to 25 nm. There is $0 \leq y \leq 1$, and $0 \leq x \leq 0.8$. For example, a range of x is $0 \leq x \leq 0.7$.

In one embodiment, a quantity of the sacrificial layers 2 may be equal to a quantity of the material layers 3. Alternatively, the sacrificial layers 2 may outnumber the material layers 3 by one layer. Namely, an extra sacrificial layer 2 is formed on the topmost material layer 3, so as to protect a channel region 13 from being affected in subsequent processing such as etching and rinsing.

Figure 2:
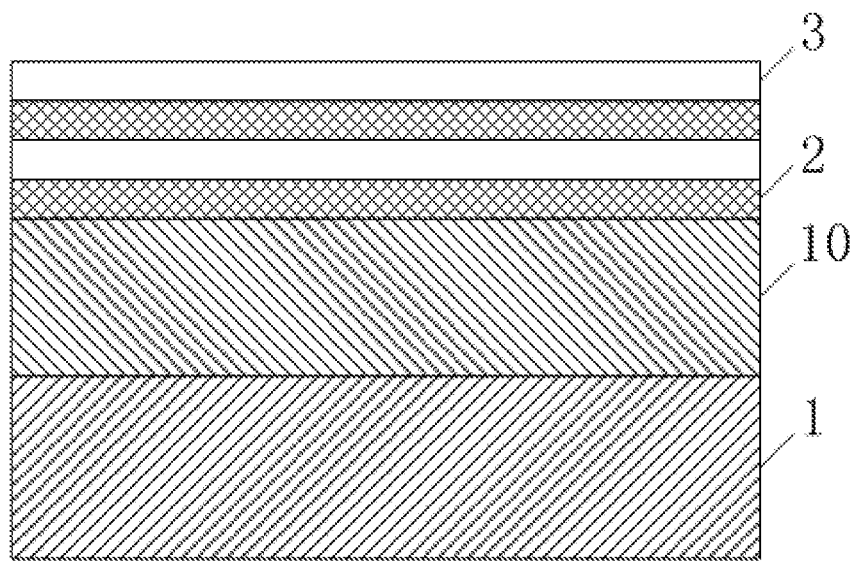
FIG. 2 is a schematic diagram of a cross section after forming a strain-buffer layer and forming sacrificial layers and material layers that are alternately stacked on a silicon substrate.

In one embodiment as shown in FIG. 2, a strain-buffer layer 10 is formed on the silicon substrate 1, before the sacrificial layers 2 and the material layers 3 that are alternately stacked are formed on the silicon substrate 1, so as to mitigate a stress the channel region 13. The strain-buffer layer 10 may be made of $Si_{1-z}Ge_z$, $0≤z≤0.8$, and has a thickness ranging from 0.5 μm to 3.5 μm. The strain-buffer layer 10 after epitaxy is planarized through chemical mechanical polishing or another technique, and thereby roughness is reduced at the surface to facilitate subsequent processing. Concentration of Ge in the strain-buffer layer 10 may be uniform, or increase gradually in a direction away from the silicon substrate 1. In an embodiment, the concentration of Ge in the strain-buffer layer 10 is increased by 10% per 1 μm in thickness.

In step S2, multiple first fins 4 are formed along a first direction on the silicon substrate 1, and multiple second fins 5 are formed along the first direction on the multiple first fins 4.

Figure 3:
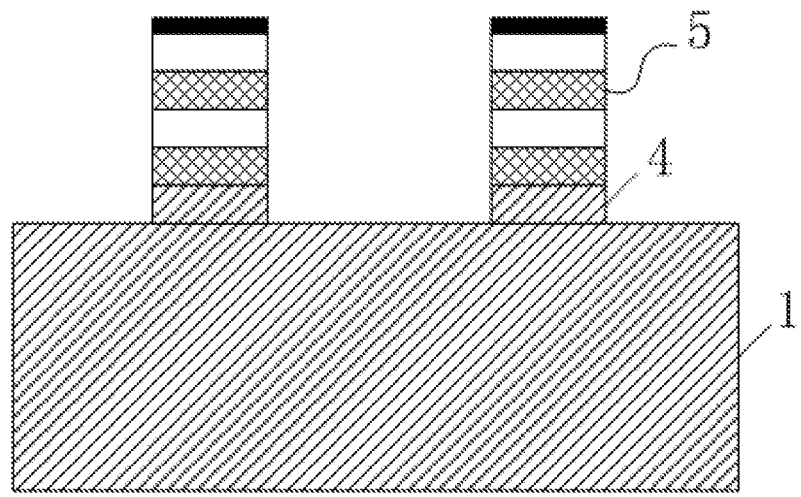
FIG. 3 is a schematic diagram of a cross section after forming first fins and second fins on a basis of an embodiment as shown in FIG. 1.

Reference is made to FIG. 3. In this step, the material layer 3, the sacrificial layer 2 and the silicon substrate 1 may be etched through dry anisotropic etching, to form the multiple first fins 4 and the multiple second fins 5 located on the first fins 4, in a case that there is no strain-buffer layer 10 formed on the silicon substrate 1. In one embodiment, the first fins 4 refer to protruding structures formed by the etched silicon substrate 1, and the second fins 5 refers to protruding structures formed by the etched sacrificial layer 2 and the etched material layer 3.

Figure 4:
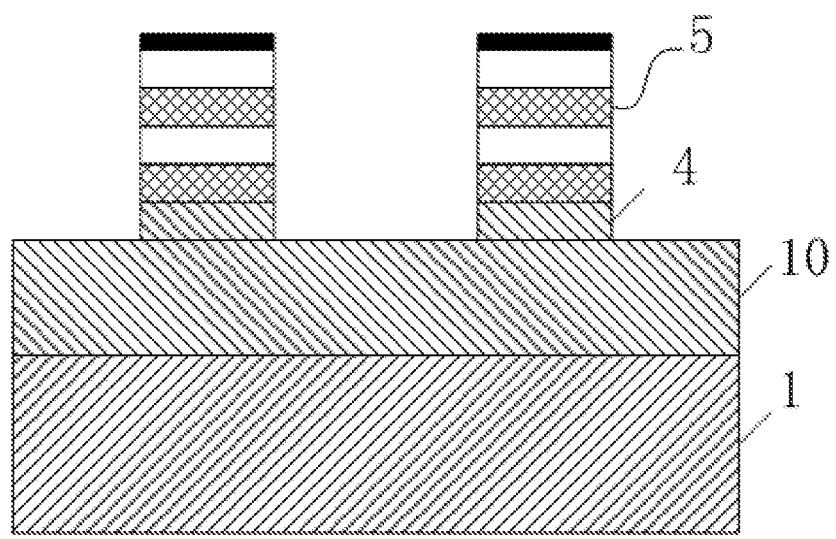
FIG. 4 is a schematic diagram of a cross section after forming first fins and second fins on a basis of an embodiment as shown in FIG. 2.

Reference is made to FIG. 4. In this step, the material layer 3, the sacrificial layer 2 and the strain-buffer layer 10 may be etched through dry anisotropic etching, to form the multiple first fins 4 and the multiple second fins 5 located on the first fins 4, in a case that the strain-buffer layer 10 is formed on the silicon substrate 1 before the sacrificial layers 2 and material layers 3 that are alternately stacked are formed on the silicon substrate 1. In one embodiment, the first fins 4 refer to protruding structures formed by the etched strain-buffer layer 10, and the second fins 5 refers to protruding structures formed by the etched sacrificial layer 2 and the etched material layer 3.

In step S3, notch structures 6 are formed on the silicon substrate 1.

In one embodiment, the step S3 may include steps S311 and S312.

In step S311, the multiple first fins 4 and the multiple second fins 5 are passivated with $O_2$ plasma.

In this step, the multiple first fins 4 and the second fins 5 are passivated with $O_2$ plasma, so as to form a protective layer outside each first fin 4 and each second fin 5. Thereby, damages to the first fins 4 and the second fins 5 are avoided when the notch structures 6 are etched in subsequent processing.

In step S312, isotropic etching is performed to form the notch structures 6 on the silicon substrate 1.

Figure 5:
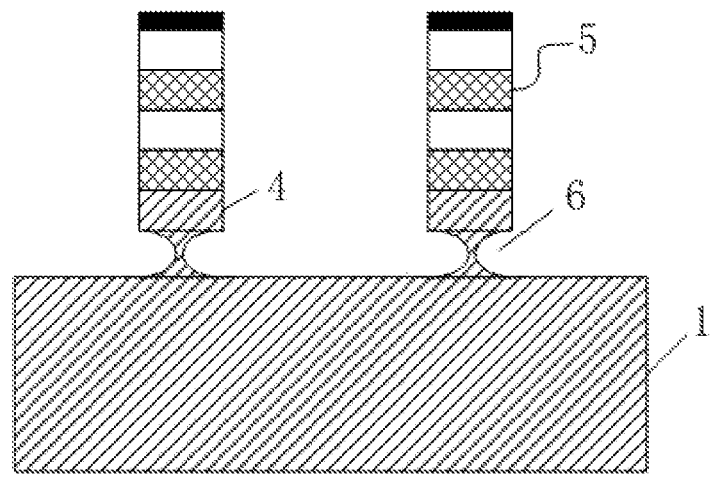
FIG. 5 is a schematic diagram of a cross section after forming notch structures on a basis of an embodiment as shown in FIG. 3.
Figure 6:
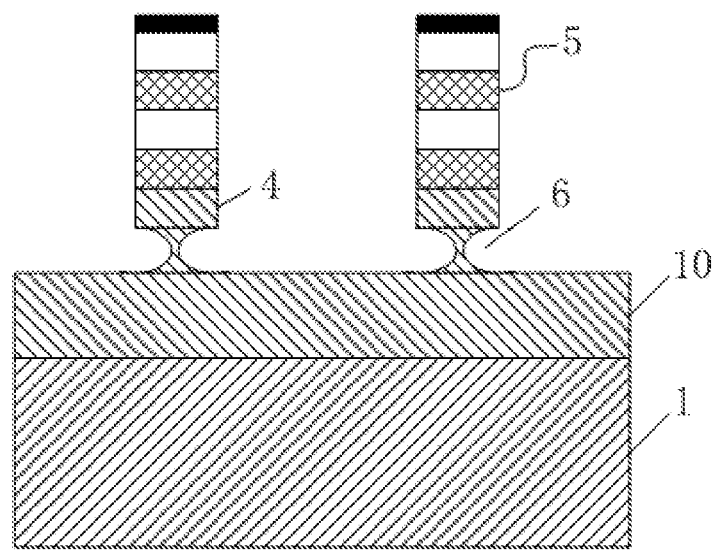
FIG. 6 is a schematic diagram of a cross section after forming notch structures on a basis of an embodiment as shown in FIG. 4.

Reference is made to FIG. 5. In this step, the silicon substrate 1 is etched through isotropic etching to form the notch structures 6 in the silicon substrate 1, in a case that there is no strain-buffer layer 10 formed on the silicon substrate 1. Reference is made to FIG. 6. In this step, the strain-buffer layer 10 is etched through isotropic etching to form the notch structures 6, in a case that the strain-buffer layer 10 is formed on the silicon substrate 1 before the sacrificial layers 2 and the material layers 3 that are alternately stacked are formed on the silicon substrate 1. After forming the notch structures 6, a hard mask formed on tops of the second fins 5 for etching the first fins 4, the second fins 5 and the notch structures 6 may be removed by using a HF (hydrofluoric) solution.

In another embodiments, the step S3 may include steps S321 and S322.

Figure 9:
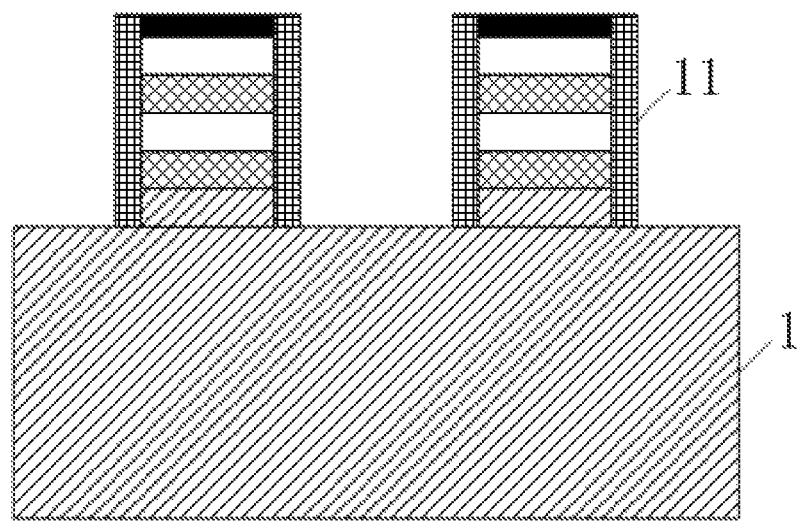
FIG. 9 is a schematic diagram of a cross section after forming second spacers on sidewalls of first fins and second fins on a basis of an embodiment as shown in FIG. 3.

In step S321, second spacers 11 are formed on sidewalls of each of the multiple first fins 4 and each of the multiple second fins 5 in the first direction and a second direction. Reference is made to FIG. 9.

In this step, the second spacers 11 are formed on the sidewalls of each first fin 4 and each second fin 5 along the first direction and the second direction. Thereby, damages to the first fins 4 and the second fins 5 are avoided when the notch structures 6 are etched in subsequent processing. In an embodiment, a second spacer material is deposited on the structure that has been formed, and is etched through anisotropic etching to form the second spacers 11. In an embodiment, the second spacers 11 are made of SiN, and a width of a bottom of the formed second spacers 11 ranges from 5 nm to 20 nm. The second direction may be a direction perpendicular to the first direction, or another direction different from the first direction, in a plane parallel to the silicon substrate.

In step S322, isotropic etching is performed to form the notch structures 6 on the silicon substrate 1.

Figure 10:
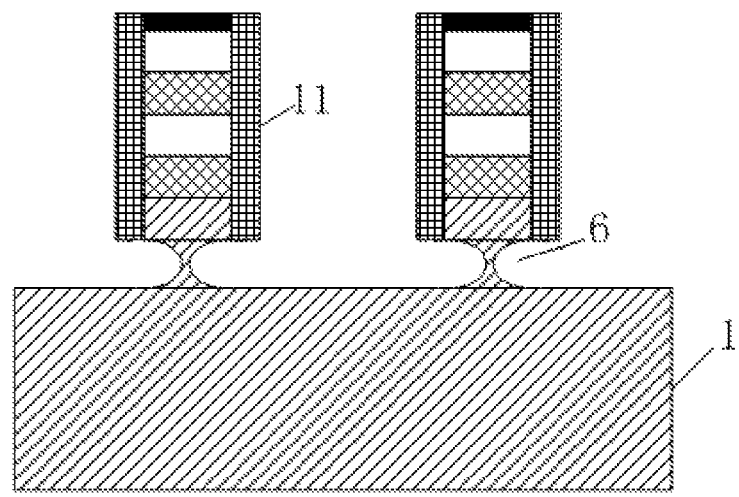
FIG. 10 is a schematic diagram of a cross section after forming notch structures on a basis of an embodiment as shown in FIG. 9.
Figure 11:
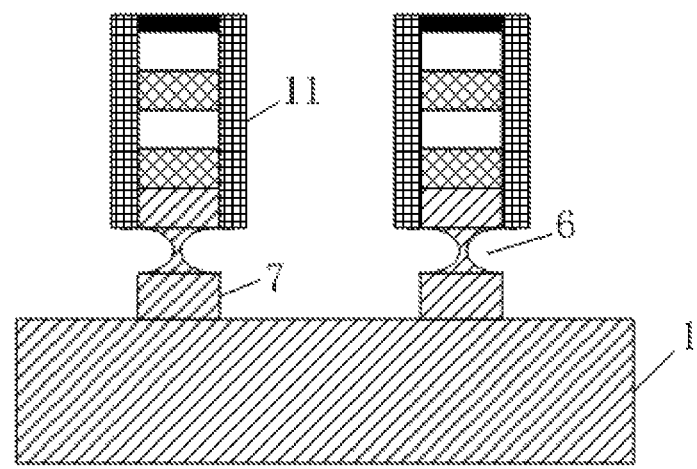
FIG. 11 is a schematic diagram of a cross section after forming third fins on a basis of an embodiment as shown in FIG. 10.

Reference is made to FIGS. 10 and 11. In this step, a process of forming the notch structures 6 on the silicon substrate 1 through isotropic etching is basically same as that in the step S312, and is not repeated herein. A difference is that it is necessary to remove the second spacers 11 on the sidewalls of the first fins 4 and the second fins 5 after the notch structures 6 are formed in this step. In an embodiment, the second spacers 11 are made of SiN, and the second spacers 11 on the sidewalls of the first fins 4 and the second fins 5 may be removed with a high selection ratio by a $H_3PO_4$ solution.

Figure 7:
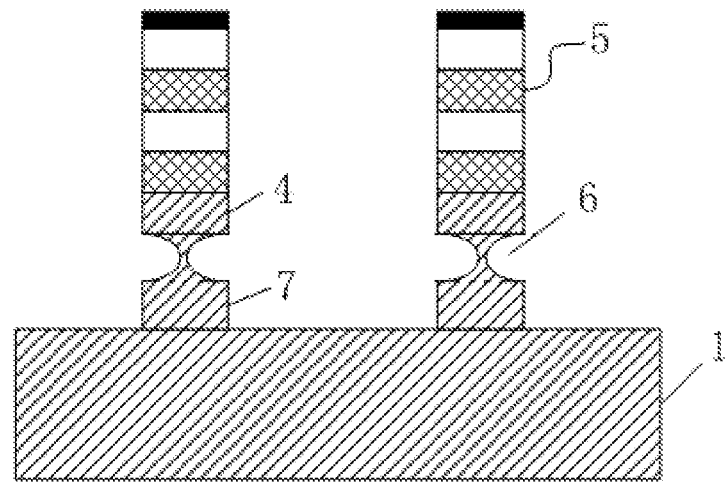
FIG. 7 is a schematic diagram of a cross section after forming third fins on a basis of an embodiment as shown in FIG. 5.
Figure 8:
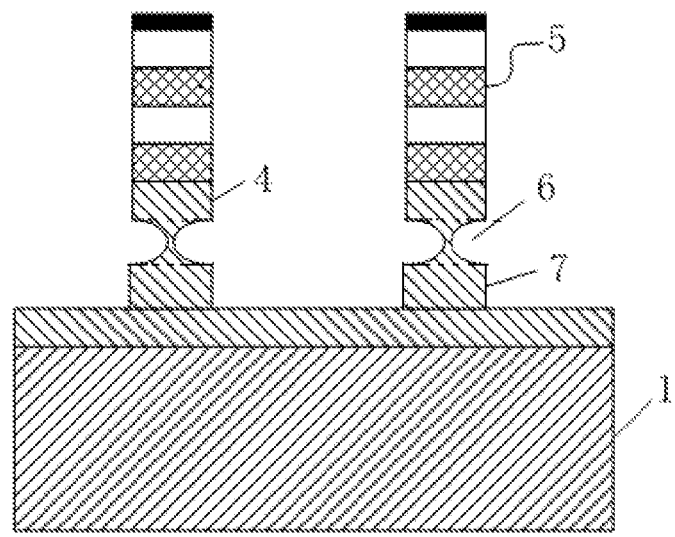
FIG. 8 is a schematic diagram of a cross section after forming third fins on a basis of an embodiment as shown in FIG. 6.

In one embodiment, multiple third fins 7 are further formed on the silicon substrate after the notch structures 6 are formed on the silicon substrate 1. Reference is made to FIG. 7. In an embodiment, the silicon substrate 1 is further etched downward to form the third fins 7, after being etched to form the notch structures 6, in a case that there is no strain-buffer layer 10 formed on the silicon substrate 1. Further, reference is made to FIG. 8. In another embodiment, the strain-buffer layer 10 is further etched downward to form the third fins 7, after being etched to form the notch structures 6, in a case that the strain-buffer layer 10 is formed on the silicon substrate 1 before the sacrificial layers 2 and the material layers 3 that are alternately stacked are formed on the silicon substrate 1.

It should be noted that in a case that the third fins 7 are required to be formed on the silicon substrate 1, the third fin 7 should be formed before removing the hard mask on top of the second fin 5 in the step S312, or before removing the second spacers 11 on the sidewalls of first fins 4 and the second fins 5 and removing the hard mask on top of the second fin 5 in the step S322. Thereby, it is prevented that the first fins 4 and the second fins 5 are damaged during etching.

In step S4, an isolator is formed in each of the notch structures 6, so as to isolate the multiple first fins 4 from the silicon substrate 1.

In one embodiment, the step S4 may include steps S41 and S42.

In step S41, the first fins 4, the second fins 5, the notch structures 6, and the third fins 7 are oxidized in an $O_2$-based atmosphere.

In step S42, the step S41 may be repeated in cycles, to form the isolator in each notch structure 6. Thereby, the first fins 4 are isolated from the silicon substrate 1. The formed structure may refer to FIG. 12.

In steps S41 and S42, the oxidation may be performed under a temperature ranging from 600° C. to 900° C. for a period ranging from 30 seconds to 60 seconds. The step S41 may be performed for 1 to 5 cycles, to form the isolator between the first fins 4 and the silicon substrate 1. The temperature, the period and the quantity of cycles may be set according to a specific situation, as long as the first fins 4 and the silicon substrate 1 can be completely isolated by the oxide 8 located between the two.

It should be noted that only the first fins 4, the second fins 5, and the notch structures 6 are required to be oxidized in the $O_2$-based atmosphere in the step S41, in a case that the third fins 7 are not formed on the silicon substrate 1 after the step S312 or S322 and before the step S4.

Figure 13:
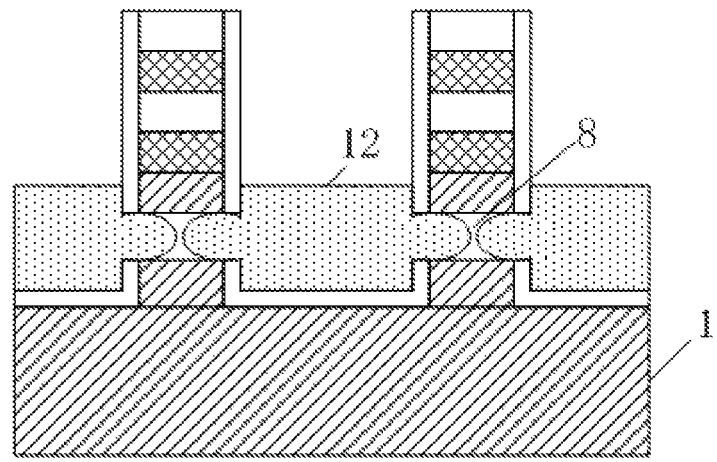
FIG. 13 is a schematic structural view after forming a shallow trench isolation on a basis of an embodiment as shown in FIG. 12.

Reference is made to FIG. 13. A shallow trench isolator 12 is further deposited in the trenches among the multiple third fins 7 or the multiple first fins 4. The shallow trench isolator 12 is planarized and etched. The shallow trench insulator 12 may be made of SiN, $Si_3N_4$, $SiO_2$, or SiCO. A thickness of the shallow trench insulator 12 should be sufficient to embed the protruding second fins 5. The shallow trench insulator 12 is planarized through chemical mechanical polishing or another other technique, until a top of the second fins 5 is exposed. Then, the shallow trench insulator 12 is etched by a HF solution to expose the second fins 5 of the whole height, so as to facilitate a subsequent gate-replacement treatment.

In step S5, a dummy gate and first spacers 9 on two sides of the dummy gate are formed along a second direction on the multiple first fins 4 and the multiple second fins 5.

In this step, a gate material for the dummy gate is deposited on the multiple first fins 4 and the multiple second fins 5. The gate material may be polysilicon or amorphous silicon. Then, the gate material is etched through wet etching or dry etching, so as to form the dummy gate. Afterwards, a material for the first spacers 9 is deposited, and then is etched through wet etching or dry etching, so as form the first spacers 9.

In step S6, the multiple second fins 5, or both the multiple first fins 4 and the multiple second fins 5 are etched at two sides of the first spacers, and a source-drain epitaxial layer is grown at the two sides of the first spacers on the etched multiple second fins 5, or on both the etched multiple second fins 5 and the etched multiple first fins 4, so as to form source-or-drain regions.

In this step, the second fins 5, or both the first fins 4 and the second fins 5 are firstly etched at the two sides of the dummy gate, so as form recessed regions. Then, a source-drain material is grown in the recessed regions at the two sides of the dummy gate, so as to form the source-or-drain regions.

In step S7, the dummy gate is replaced with a gate stack in a gate-replacement treatment, so as to form the stacked nanowire or nanosheet GAA device.

In one embodiment, the step S7 may include steps S71 to S73.

In step S71, an oxide dielectric layer is deposited on the structure that has been formed, and the oxide dielectric layer is planarized.

In this step, the oxide dielectric layer is deposited on the formed structure. The oxide dielectric layer may be made of $SiO_2$, and a thickness of the oxide dielectric layer should be sufficient to embed the protruding dummy gate. The oxide dielectric layer is planarized after being deposited, so as to expose a top of the dummy gate.

In step S72, the dummy gate is removed, and the at least one sacrificial layer 2 in a gate region, or the at least one sacrificial layer 2 and the multiple first fins 4 in a gate region, are removed so as to expose a channel region 13.

Figure 14:
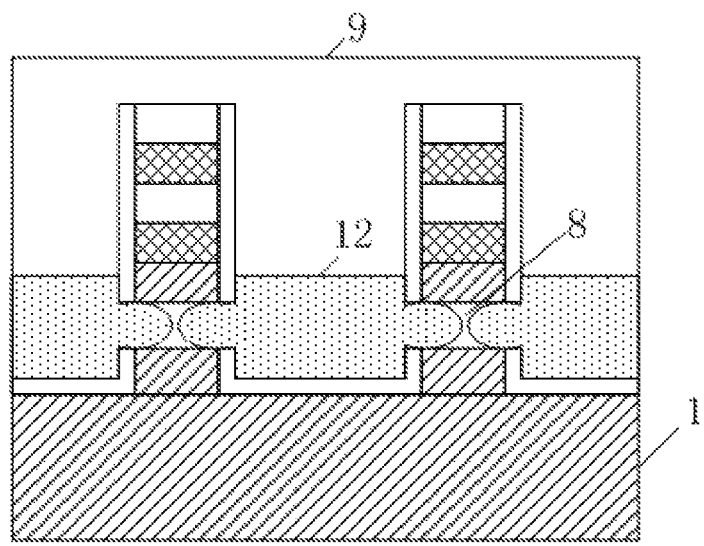
FIG. 14 is a schematic structural view after forming first spacers and removing a dummy gate on a basis of an embodiment as shown in FIG. 13.

In this step, the dummy gate in the gate region can be removed through dry etching or wet etching, and the formed structure may refer to FIG. 14. The stack formed by alternate sacrificial layers 2 and material layers 3, and the top of the first fins 4, are exposed in the gate region after the dummy gate is removed. Reference is made to FIGS. 16 and 18. The exposed sacrificial layers 2 may be removed with high selectivity. In such case, the first fins 4 that is different from the sacrificial layer 2 in material may be retained in the gate region. Reference is further made to FIGS. 15 and 17. The sacrificial layers 2 and the first fin 4 may be removed without selectivity, in releasing the channel region 13.

Figure 12:
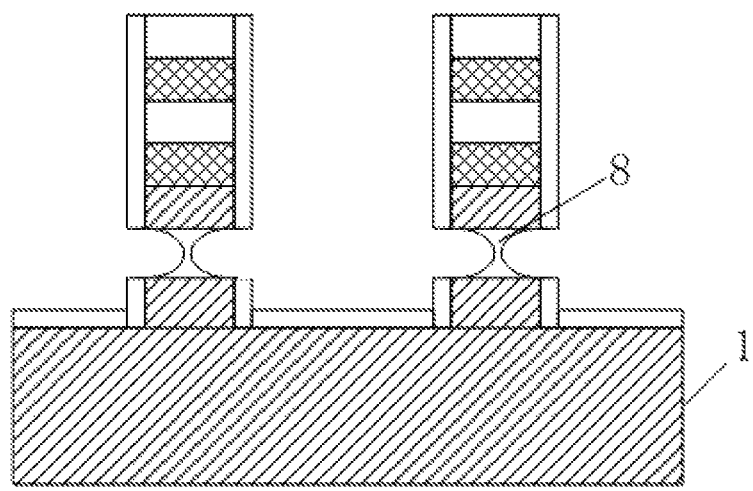
FIG. 12 is a schematic diagram of a cross section after forming an oxide in each notch structure on a basis of an embodiment as shown in FIG. 7.

It should be noted that FIGS. 12 to 14 only show that the isolator is formed and the dummy gate is removed in the case that there is no strain-buffer layer 10 formed on the silicon substrate 1. It should not be construed that the corresponding steps can only be implemented without the strain-buffer layer 10. The steps of forming the isolator and removing the dummy gate can also be implemented in the case that there is the strain-buffer layer 10.

In step S73, a gate dielectric layer 14 and a gate 15 on the gate dielectric layer are formed in the channel region 13.

In this step, a layer of the gate dielectric layer 4 may be deposited in the channel region 13 through technique such as atomic layer deposition. In an embodiment, the gate dielectric layer 14 is a layer with a high dielectric constant. For example, the layer with a high dielectric constant may be made of materials with a high dielectric constant, such as $HfO_2$ (hafnium dioxide), $ZrO_2$ (zirconium dioxide), $TiO_2$ (titanium dioxide) or $Al_2O_3$ (aluminum trioxide). The gate 15 is formed on the gate dielectric layer 14 after the above deposition. The gate 5 may be a stack of one or more materials that meet a requirement, such as TaN (tantalum nitride), TiN (titanium nitride), TiAlC (carbon aluminum titanium). Thicknesses of the gate dielectric layer 14 and the gate electrode 15 may be set respectively, according to a specific situation.

In summary, the method for manufacturing the stacked nanowire or nanosheet GAA device according to an embodiment of the present application also has the same advantages as the aforementioned semiconductor device. Namely, an oxide for isolation is formed in the notch structures 6 between the silicon substrate 1 and a silicon-based channel or a high-mobility channel, such as a Ge channel. It is ensured that a leakage current is reduced while maintaining a high performance of the channel.

As described above, the above embodiments are only intended to describe the technical solutions of the present disclosure, and not to limit the present disclosure. Although the present disclosure is described in detail with reference to the above embodiments, those skilled in the art should understand that, modifications can be made to the technical solutions recorded in the above embodiments, or equivalent replacements can be made to some of the technical features thereof, and the modifications and the replacements will not make the corresponding technical solutions deviate from the spirit and the scope of the technical solutions of the embodiments of the present disclosure.

The invention claimed is:

1. A stacked nanowire or nanosheet gate-all-around (GAA) device, comprising:
    a silicon substrate;
    stacked nanowires or nanosheets, located on the silicon substrate, wherein each of the stacked nanowires or nanosheets extends along a first direction, and the stacked nanowires or nanosheets comprises a plurality of nanowires or nanosheets that is stacked;
    a gate stack, surrounding each of the stacked nanowires or nanosheets, wherein the gate stack extends along a second direction, first spacers are located on two sidewalls of the gate stack, and the sidewalls are in the first direction of the gate stack;
    source-or-drain regions, located at two sides of the gate stack along the first direction; and
    a channel region, comprising a portion of the stacked nanowires or nanosheets that is located between the first spacers;
    wherein a notch structure recessed inward is located between the stacked nanowires or nanosheets and the silicon substrate, the notch structure comprises a first part and a second part, the first part is located on a middle of the notch structure, the second part is located on an upper side and a lower side of the first part in a direction perpendicular to the silicon substrate, and a width of the first part is less than a width of the second part; and
    wherein the notch structure is oxidized from outside to inside, the first part is completely oxidized and is configured to provide an isolator for pinching off, the second part is partially oxidized, the isolator for pinching off is an oxide and is configured to isolate the stacked nanowires or nanosheets from the silicon substrate, and a height of the isolator for pinching off is greater than 3 nm.

2. The stacked nanowire or nanosheet GAA device according to claim 1, wherein each of the stacked GAA nanowires or nanosheets is made of $Si_{1-y}Ge_y$, and $0 \leq y \leq 1$.

3. The stacked nanowire or nanosheet GAA device according to claim 1, wherein:
    a silicon-etched structure is located between the silicon substrate and the notch structure, or
    a silicon-etched structure is located between the silicon substrate and the notch structure, and another silicon-etched structure is located between the gate stack and the notch structure.

4. The stacked nanowire or nanosheet GAA device according to claim 1, wherein:
    a strain-buffer structure is located between the silicon substrate and the notch structure, or
    a strain-buffer structure is located between the silicon substrate and the notch structure, and another strain-buffer structure is located between the gate stack and the notch structure; and
    wherein each of the strain-buffer structure and the another strain-buffer structure is made of $Si_{1-z}Ge_z$, and $0 \leq z \leq 0.8$.

* * * * *